United States Patent [19]
Brohm et al.

[11] Patent Number: 5,096,147
[45] Date of Patent: Mar. 17, 1992

[54] IN-CIRCUIT CONTACT MONITOR

[75] Inventors: John R. Brohm, Ontario; Walter Friesen, Downsview, both of Canada

[73] Assignee: Sel Division, Alcatel Canada Inc., Ontario, Canada

[21] Appl. No.: 615,496

[22] Filed: Nov. 19, 1990

[51] Int. Cl.$^5$ .................... G08C 19/04; B61L 19/08
[52] U.S. Cl. .................... 246/162; 246/253; 340/644
[58] Field of Search ............ 246/162, 220, 253, 256; 361/205; 340/510, 532, 536, 644, 656

[56] References Cited

U.S. PATENT DOCUMENTS

| | | | |
|---|---|---|---|
| 1,862,212 | 6/1932 | Dowling | 246/256 X |
| 1,896,370 | 3/1933 | Peter | 246/162 |
| 2,575,447 | 11/1951 | Gossick | 340/510 X |
| 3,215,996 | 11/1965 | Schwartz et al. | 340/644 |
| 3,587,096 | 6/1971 | Teichmann | 340/644 X |
| 3,746,880 | 7/1973 | Iritani et al. | 340/644 X |
| 3,845,363 | 10/1974 | Billion | 361/205 X |
| 3,936,705 | 2/1976 | Billion | 361/205 |
| 4,322,769 | 3/1982 | Cooper | 340/644 X |
| 4,580,062 | 4/1986 | MacLaughlin | 340/644 X |
| 4,672,310 | 6/1987 | Sayed | 340/644 X |
| 4,689,570 | 8/1987 | Ohgaki et al. | 340/644 X |
| 4,691,143 | 9/1987 | Lange | 340/644 X |

Primary Examiner—Robert J. Spar
Assistant Examiner—Scott L. Lowe
Attorney, Agent, or Firm—Ware, Fressola, Van Der Sluys & Adolphson

[57] ABSTRACT

An in-circuit contact monitor for providing reliable and safe detection of the position of fail safe, or vital, circuit contacts in railroad signaling and inter-locking control circuits comprises an impedance network arranged in a bridge configuration, a low-power, high-frequency signal source, an isolation transformer, and a pair of DC blocking capacitors. The low-power, high-frequency AC source provides energy for an isolated circuit which is used in detecting the toggling of an individual circuit contact. The circuit is configured such that the vital circuitry, which is connected to the circuit contact, is completely isolated from the DC components generated by the low-power, high-voltage AC source. The isolation transformer acts to isolate the monitor system from the in-circuit contact monitor circuitry and thus the vital circuitry.

9 Claims, 2 Drawing Sheets

IN-CIRCUIT CONTACT MONITOR

BACKGROUND OF THE INVENTION

1. Field of the Invention

The present invention relates to circuits for detecting the position of circuit contacts in switches in railroad signaling or interlocking control circuits and more particularly to a circuit for safely and reliably monitoring the position of fail safe, or vital, circuit contacts without falsely activating a vital circuit.

2. Description of the Prior Art

In railroad signaling and interlocking control circuits, fail safe, or vital, circuit contacts are used for various switching purposes such as the turning off and on of signal lights. Typically four to six (4-6) contacts are configured in a single relay, the relay being used to control one aspect in the circuit. It is necessary to safely monitor these circuit contacts to verify correct circuit operation and to provide evidence of actual operation in the event of an investigation. Presently, two methods are normally used to monitor circuit contacts: (1) a series method; and (2) an isolated potential method.

The series method relies on electrical components, i.e., light emitting diodes, resistors, relays, etc., inserted in series with the circuit contact, the component indicating the current flow through the circuit contact. The contact is monitored based upon the actual circuit current flow, the current flow being indicated by the condition of the component.

Although the electrical component will indicate whether the circuit is active, if there is more than one contact in the circuit, the electrical component cannot identify which contact is open/closed. Furthermore, inserting electrical components in series in these vital circuits can influence the critical wiring characteristics of the vital signal relays, possibly causing the potential for wrong-side signal system failures.

A variation of the series method is accomplished by utilizing a spare circuit contact in each relay to be monitored thereby precluding the risk of distorting the vital circuit and allowing the monitoring of each relay in a series. However, when each contact in the relay must be used, the relay cannot be monitored in this way.

In those cases where there are no spare contacts in the relay, railroads must install additional vital signal repeater relays in order to monitor safely the individual circuit contacts. In such a situation, the contact in question is effectively taken out of the vital circuit and is used to activate a contact in an additional relay which acts in place of the contact in question. The contact in question can thereby be monitored without affecting the vital circuitry. The need for these additional relays causes the railroad much higher cost and rapidly consumes any available space left in the signaling case or housing.

The isolated potential method relies on a separate, isolated energy source used as a local power supply to monitor the contact in question. The monitor source (typically a 12 v DC battery) is connected in line with an active circuit contact, a monitor circuit being used to detect the monitor source thereby indicating the condition of the contact in question. Great care and many precautions must be taken to preclude the possibility of unsafe or hazardous circuit conditions being created as a result of the insertion of this kind of monitor circuit. For example, it must be insured at all times that the monitor source be isolated from the circuit's return in order to prevent the monitor circuit from falsely activating a vital signal circuit (e.g., Red or stop signal being changed to Green or proceed signal) as a result of leaking monitor circuit.

The isolation potential method carries great risk in falsely activating a vital signal circuit. While a totally isolated battery theoretically would permit safe detection of a single contact, there is too much of a risk of ground faults (either elsewhere in the system or as a result of a direct connection to the isolated battery) to install such a monitor system in a signal case or housing safely.

SUMMARY OF THE INVENTION

The present invention contemplates an improved in-circuit contact monitor for the reliable and safe detection of the position of fail safe, or vital, circuit contacts and railroad signaling and interlocking control circuits. The present invention is fashioned such that any contact in the vital signal circuit may be monitored without the possibility of falsely feeding energy to the vital circuit, thus precluding the possibility of an unsafe circuit condition.

The present invention comprises a circuit having four impedances ($Z_1$, $Z_2$, $Z_3$, $Z_4$) configured in a four node bridge arrangement having four network terminals (A, B, C, D), a low power, high frequency signal source connected between network terminals B and C and an isolation transformer having a primary and a secondary coil, the secondary coil being connected across network terminals A and D, and a pair of capacitors.

In a first preferred embodiment, the circuit contact to be monitored is connected in series with and between the two DC blocking capacitors, one capacitor being connected to the signal source, the other capacitor being connected to network terminal B. The voltage across the primary coil of the isolation transformer, which is connected to a monitor system, is monitored by the monitor system, a change in potential across the primary coil corresponding to an opening or closing of the monitored circuit contact. Since the invention utilizes an isolated, high frequency AC source and a completely isolated monitor system, the monitoring of the circuit contact under test will cause no disruption in the vital circuit operation.

In a second preferred embodiment, the circuit contact being monitored is connected in parallel with one of the impedances ($Z_1$, $Z_2$, $Z_3$, $Z_4$). As in the first preferred embodiment, the impedances are configured in a bridge arrangement, although, in this embodiment, the impedance values are chosen so that the bridge is balanced. Because the bridge is balanced, a voltage potential of zero will appear across network terminals A and D when the contact in question is in the open position. When the contact is closed, however, a voltage potential variation will result across the primary coil of the isolation transformer. Again, the monitor system and the high frequency AC source are isolated from the vital circuitry thereby precluding the possibility of an unsafe circuit condition.

A primary objective of the present invention is to provide an in-circuit contact monitor for detecting the condition of a circuit contact without the potential for causing wrong side signal system failures.

Another objective of the present invention to provide an in-circuit contact monitor which is fashioned such that any contact in the vital signal circuit may be monitored.

Another objective of the present invention is to provide an in-circuit contact monitor which will safely monitor individual circuit contacts without the need of additional vital signal repeater relays.

The above and other objectives and advantages of the invention will become more apparent upon reading the description of the invention in connection with the drawings described below.

DESCRIPTION OF THE PREFERRED EMBODIMENT

Figure 1:
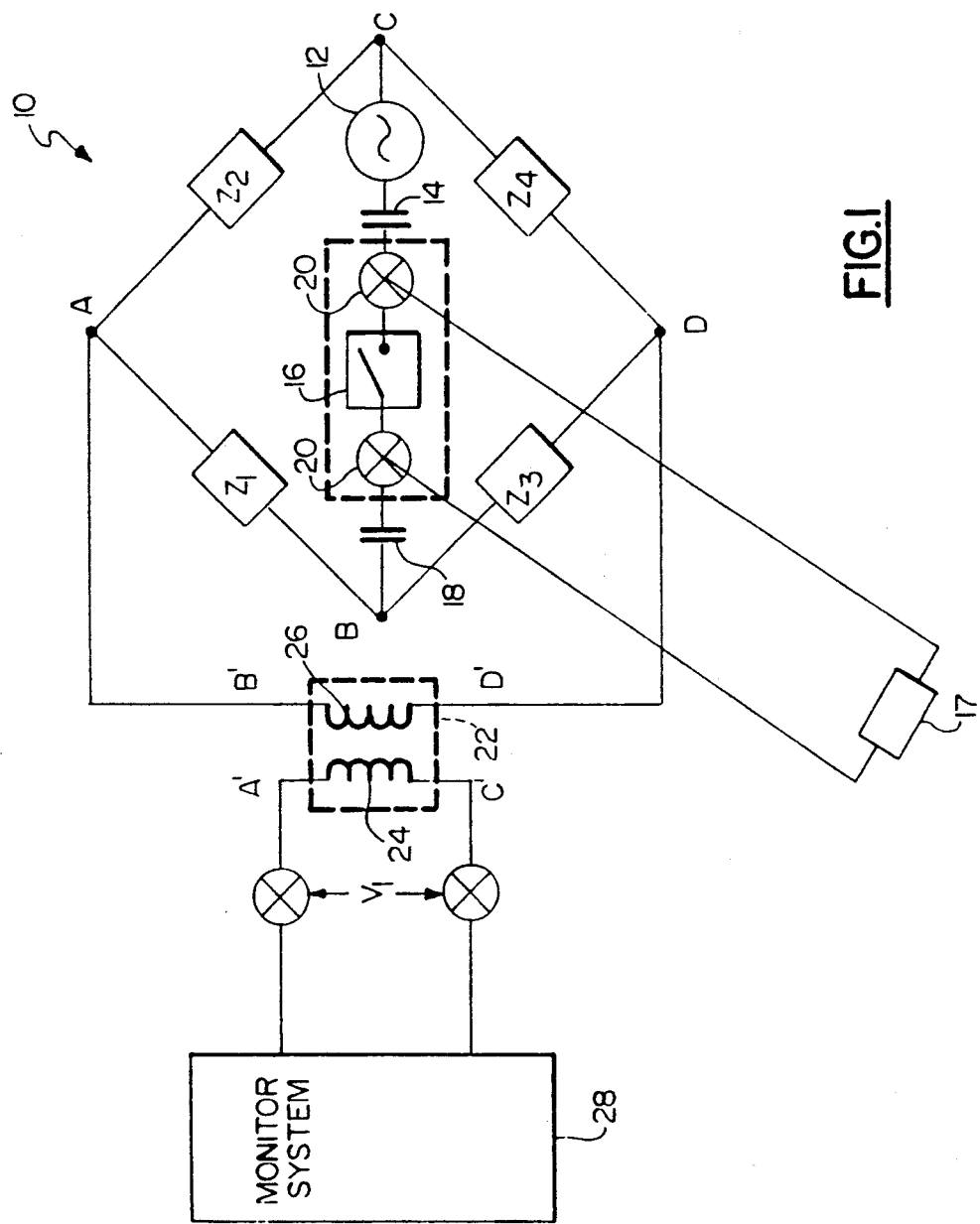
FIG. 1 is a schematic diagram illustrating an in-circuit contact monitor in the first embodiment of the present invention.

FIG. 1 illustrates a schematic diagram of an in-circuit contact monitor of a first preferred embodiment of the present invention. The in-circuit contact monitor 10 comprises four impedances ($Z_1$, $Z_2$, $Z_3$, $Z_4$) configured in a bridge arrangement, the arrangement having four network terminals (A, B, C, D). As can be seen in FIG. 1, each of the impedances ($Z_1$, $Z_2$, $Z_3$, $Z_4$) is connected between two of the network terminals. A low power (typically less than 3 mW), high frequency (typically 20–50 KHz) signal source 12 is connected, at one end, to network terminal C and, at the other end, to a first end of a first DC blocking capacitor 14. A circuit contact 16 to be monitored is part of vital circuit 17, and is connected to the in-circuit contact monitor 10 via first and second terminals 20. In the contact monitor 10, the contact 16 is connected between a second end of the first DC blocking capacitor 14 and a first end of a second DC blocking capacitor 18. A second end of the second DC blocking capacitor 18 is connected to network terminal B. DC blocking capacitors 14, 18 act to block any DC components from the signal source 12 from leaking into the vital circuitry, allowing only the AC components to pass. Because the vital circuit is DC sensitive, AC signals which pass into the vital circuit from signal source 12 have no effect on the vital circuit. Furthermore, the signal source power level is chosen such that the vital circuit contacts will not be falsely switched if the AC signal is rectified to a DC value.

The in-circuit contact monitor 10 further comprises an isolation transformer 22 having a primary coil 24 and a secondary coil 26. Isolation transformer 22 has four terminals (A', B', C', D'), B' and D' of the secondary coil 26 being connected to network terminals A and D respectively. The remaining two terminals (A', C') of the primary coil 24 are connected to a monitor system 28. The monitor system 28 monitors the voltage potential $V_1$ across the primary coil 24.

In operation, the in-circuit contact monitor 10 of the present invention works as follows:

The signal source 12 functions to generate a low power, high frequency signal. Because the bridge is unbalanced, a certain voltage potential $V_1$ will appear across the primary coil 24 of the isolation transformer 22 when circuit contact 16 is in the opened or non-conducting position. The monitor system 28 detects voltage potential $V_1$. Upon the occurrence of the circuit contact 16 toggling, or closing, voltage potential $V_1$ changes due to the completion of the signal source circuit, the monitor system 28 detecting such a change. Because contact 16 is connected between two DC blocking capacitors, vital circuit 17 is isolated from the DC components generated by the contact monitor 10. Furthermore, the isolation transformer 22 functions as an isolator between the monitor system 28 and the remainder of the in-circuit contact monitor 10 such that a short circuit in the monitor system 28 will not effect any circuitry connected to the secondary coil 26 of the isolation transformer 22, and vice versa. In addition, the impedances ($Z_1$, $Z_2$, $Z_3$, $Z_4$) are chosen to have high resistive values for protection of vital circuit 17 in case of DC blocking capacitor fault, that is, the highly resistive impedances will attenuate the signal source output to protect the vital circuitry if one or both of the DC blocking capacitors short circuit.

Figure 2:
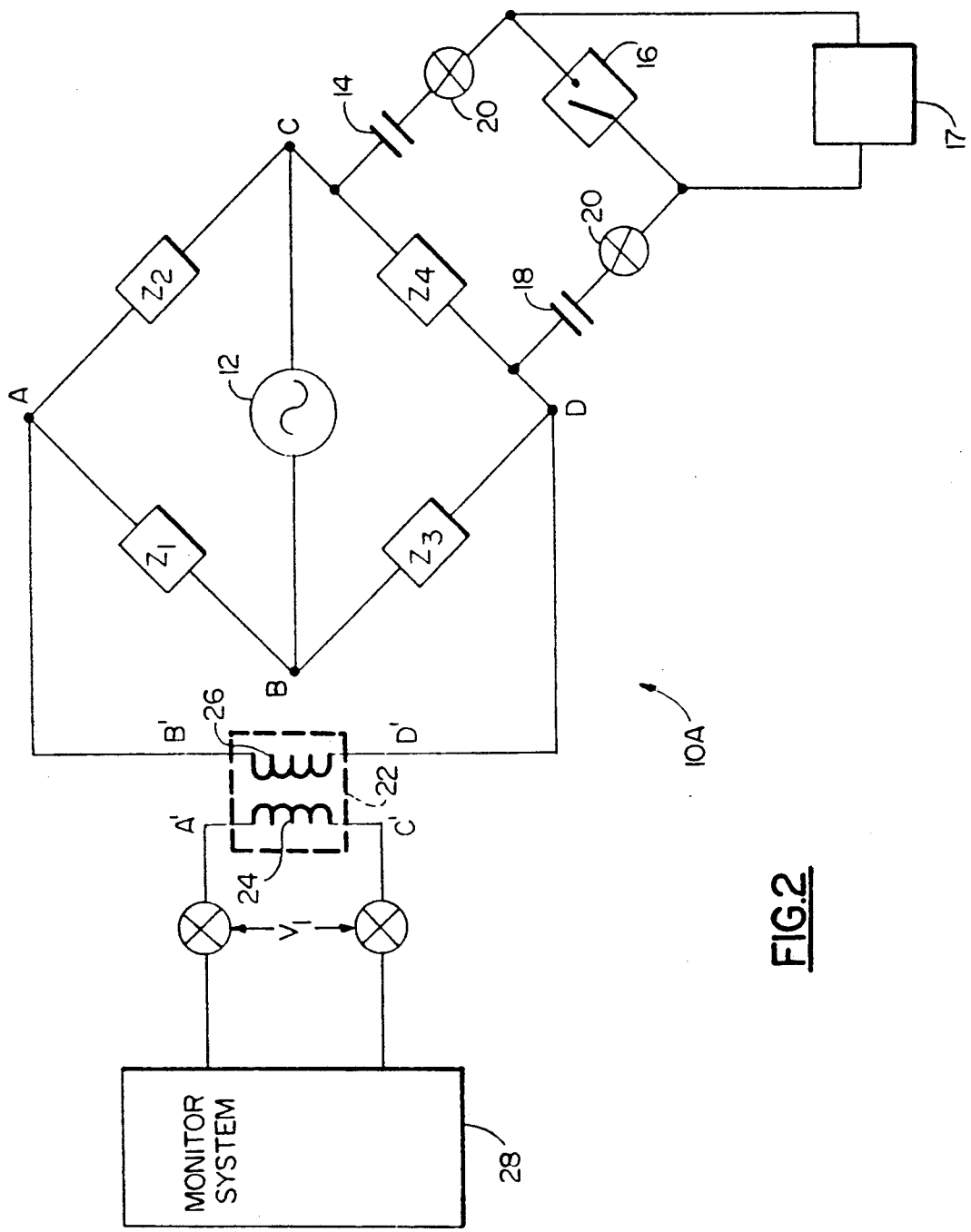
FIG. 2 is a schematic diagram of an in-circuit contact monitor in the second embodiment of the present invention.

FIG. 2 illustrates a second embodiment of an in-circuit contact monitor 10A of the present invention. As in the first embodiment, in-circuit contact monitor 10A comprises four impedances ($Z_1$, $Z_2$, $Z_3$, $Z_4$) configured in a bridge arrangement. The impedances ($Z_1$, $Z_2$, $Z_3$, $Z_4$) are connected together such that they form four network terminals (A, B, C, D), a low power, high-frequency signal source 12 being connected between network terminals B and C. The impedance values ($Z_1$, $Z_2$, $Z_3$, $Z_4$) in the second embodiment are chosen so that the bridge is balanced.

An isolation transformer, having a primary coil 24 and a secondary coil 26, has four terminals (A', B', C', D'). The terminals (B', D') of the secondary coil 26 are connected to network terminals A and D respectively. Terminals A' and C' of the primary coil 24 are connected to a monitor system.

The circuit contact 16 to be monitored is connected to terminals 20 which are connected at one end to a first DC blocking capacitor 14 and, at the other end, to a second DC blocking capacitor 18. The remaining ends of first and second DC blocking capacitors 14 and 18 are connected to network terminals C and D, respectively. Thus, first and second DC blocking capacitors 14, 18 and circuit contact 16 are connected in parallel with impedance $Z_4$. It should be noted that these three components may be connected in parallel with any of the four impedances ($Z_1$, $Z_2$, $Z_3$, $Z_4$) and the in-circuit contact monitor 10A will function in an equivalent manner.

The in-circuit contact monitor 10A functions as follows:

When the circuit contact 16 is in the open, or nonconducting position, a voltage potential $V_1$ equal to zero appears across the primary coil 24 of the isolation transformer 22, and this voltage potential is detected by the monitor system 28. When the circuit contact 16 toggles into the closed, or conducting position, the voltage potential $V_1$ across the primary coil 24 of the isolation transformer 22 changes due to the short circuit in one of the legs of the impedance network, the network now becoming unbalanced. This new voltage potential, $V_1$, is detected by monitor system 28. Notice that monitor system is isolated from the remaining portions of the in-circuit contact monitor 10A by isolation transformer 22, and the DC blocking capacitors 14 and 18 act to isolate circuit contact 16 from any DC voltage components. The vital circuitry 17 connected to terminals 20 is isolated from any DC components generated by the the in-circuit contact monitor 10A. The AC components which are impressed upon the vital circuitry do not affect the DC sensitive vital circuit. Furthermore, because the signal source 12 is chosen to have a lower power level, any AC signals rectified by the vital circuit will not cause any false signaling.

Thus, it can be seen that the reliable and safe detection of the position of fail safe, or vital, circuit contacts and railroad signaling in interlocking control circuits can be accomplished through the utilization of the in-circuit contact monitor of the present invention.

What is claimed is:

1. An in-circuit contact monitor for detecting the condition of at least one two-position circuit contact in a DC circuit, the monitor comprising:
    a four node bridge circuit;
    means connected to a first pair of opposite nodes of the bridge circuit for energizing the bridge with an AC signal;
    means for connecting the circuit contact into the bridge;
    a transformer having first and second coils, the first coil being connected across a second pair of opposite nodes of the bridge circuit; and
    means connected to the second transformer coil for monitoring an output from the second coil, whereby a change in state of the circuit contact is reflected in the output of the second coil and is detected by the monitor.

2. The in-circuit contact monitor as defined in claim 1, wherein the in-circuit contact monitor further comprises a first capacitor connected to a first circuit node and a first terminal of the connecting means; and
    a second capacitor connected to a second circuit node and a second terminal of the connecting means.

3. The in-circuit contact monitor as defined in claim 2, wherein the energizing means is connected between a circuit node and one of the first and second capacitors.

4. The in-circuit contact monitor as defined in claim 2, wherein the first and second circuit nodes are adjacent nodes, so that the first capacitor, second capacitor and circuit contact when connected to the connecting means are connected across adjacent nodes.

5. The in-circuit contact monitor as defined in claim 1 wherein the DC circuit is a vital circuit used for railroad signaling control.

6. The in-circuit contact monitor as defined in claim 1 wherein the DC circuit is a vital circuit used for railroad interlocking control.

7. The in-circuit contact monitor as defined in claim 1, wherein the AC signal has a frequency in the range of 20–50 kHz.

8. The in-circuit contact monitor as defined in claim 1, wherein the AC signal has a low power level.

9. The in-circuit contact monitor as defined in claim 8, wherein the AC signal has a power level of no more than 3 mW.

* * * * *